United States Patent
Smith et al.

(10) Patent No.: US 10,655,959 B2
(45) Date of Patent: May 19, 2020

(54) HIGH DENSITY SLIDER CLAMP FIXTURE

(71) Applicant: SANDISK TECHNOLOGIES LLC, Plano, TX (US)

(72) Inventors: Darrick T. Smith, San Jose, CA (US); Glenn P. Gee, San Jose, CA (US); Anthony M. Bagus, Caloocan (PH); Teodosio B. Quilapquilap, Jr., Las Pinas (PH); Sharon C. Agtina, Santa Rosa (PH)

(73) Assignee: SanDisk Technologies LLC, Plano, TX (US)

( * ) Notice: Subject to any disclaimer, the term of this patent is extended or adjusted under 35 U.S.C. 154(b) by 209 days.

(21) Appl. No.: 15/852,068

(22) Filed: Dec. 22, 2017

(65) Prior Publication Data

US 2019/0195625 A1  Jun. 27, 2019

(51) Int. Cl.
*G01B 15/00* (2006.01)
*G11B 5/31* (2006.01)
*B25B 5/08* (2006.01)
*H05K 7/12* (2006.01)

(52) U.S. Cl.
CPC .............. *G01B 15/00* (2013.01); *B25B 5/08* (2013.01); *G11B 5/3166* (2013.01); *G11B 5/3173* (2013.01); *H05K 7/12* (2013.01)

(58) Field of Classification Search
CPC .......... B25B 1/2442; B25B 1/04; B25B 1/06; B25B 1/08; B25B 1/20; B25B 5/04; B25B 5/08; B25B 5/003; F16B 2/18; H05K 7/12; H05K 7/1404
See application file for complete search history.

(56) References Cited

U.S. PATENT DOCUMENTS

| | | | | | |
|---|---|---|---|---|---|
| 3,665,370 | A | * | 5/1972 | Hartmann | H01R 12/88 439/260 |
| 3,777,596 | A | * | 12/1973 | Smyers, Jr. | B25B 23/0035 81/177.85 |
| 3,975,805 | A | * | 8/1976 | Spurling | F16B 2/18 403/374.3 |
| 4,157,583 | A | * | 6/1979 | Basmajian | H05K 7/20545 361/707 |
| 4,502,601 | A | * | 3/1985 | Husted | H05K 7/1404 211/41.17 |
| 6,481,204 | B1 | * | 11/2002 | Yuschak | B25B 5/003 60/527 |

FOREIGN PATENT DOCUMENTS

CA   2470290 A1 * 12/2005 ............. A47B 81/00

* cited by examiner

*Primary Examiner* — Tyrone V Hall, Jr.
(74) *Attorney, Agent, or Firm* — Vierra Magen Marcus LLP

(57) ABSTRACT

A high density slider clamp fixture is disclosed for accurately positioning a large number of head sliders for metrology testing. The slider clamp fixture may include a single piece, monolithic structure comprising a large number of slider nests, aligned in rows and columns in the slider fixture. Each slider nest includes a reference datum surface machined to precisely align with all other reference datum surfaces in a row of the monolithic structure. Each slider nest further includes a flexure clamp for independent clamping of each slider in the row against the reference datum surfaces.

19 Claims, 18 Drawing Sheets

HIGH DENSITY SLIDER CLAMP FIXTURE

BACKGROUND

Critical dimension scanning electron microscopes (CD-SEMs) and Dual Beam Focused Ion Beam SEMs (FIB) are often used to analyze and provide measurement of sub-micron features in surface and cross-sections of the read and write heads of a magnetic transducer in magnetic hard disk drives. A group of sliders including read/write heads may be arranged in a fixture called a rowbar holder, and from there, the sliders may be transferred onto an adhesive strip on a wafer for analysis in the CD-SEM and FIB. When testing head sliders in a high throughput automated metrology CD-SEM and FIB tool, it is important to precisely align ends of the sliders including the deposited read and write head film layers along a reference datum. If the high throughput CD-SEM or FIB encounters a misaligned head slider, it may be unable to automatically progress analysis of features of the succeeding slider's read/write layers, requiring stoppage of the metrology test while a technician manually re-teaches position reference in the application software on misaligned sliders and then resumes the automated testing run. High throughput CD-SEMs and FIBs are expensive tools to run, and any unexpected work stoppage to re-teach misaligned sliders can be costly.

A problem with conventional slider testing as explained above is that the dimensions of head sliders can vary slightly due to manufacturing tolerances. Thus, when clamped within a rowbar holder, the deposited end of some sliders may rest properly against the reference datum, but smaller sliders may rotate slightly, or otherwise have deposited ends which are not flush against the reference datum. In practice, this happens to more than 80% of sliders. This large incidence of misaligned sliders is resulting in an unacceptably high rate of work stoppages during CD-SEM and FIB testing.

DETAILED DESCRIPTION

Figure 1:
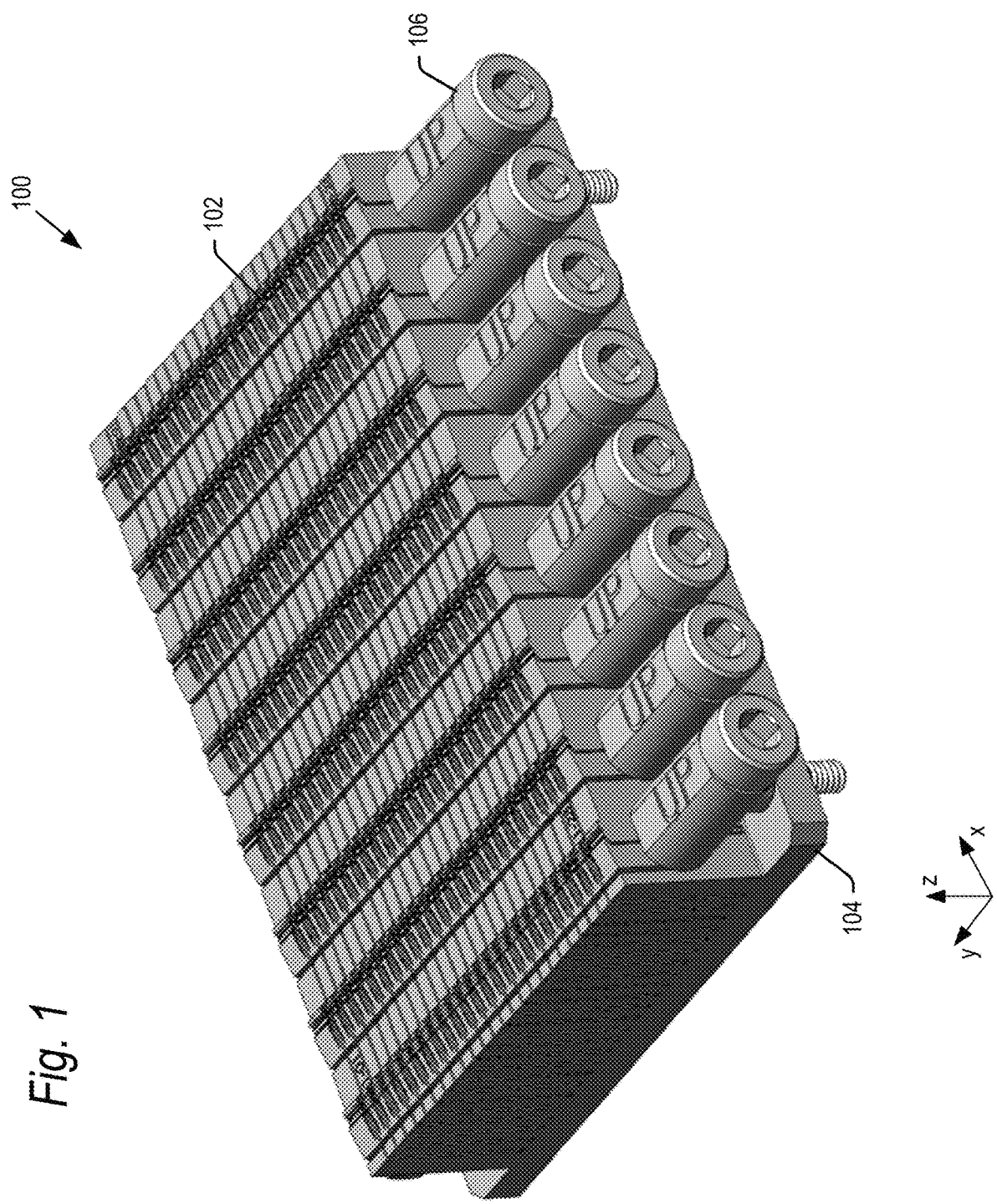
FIG. 1 is a perspective view of a clamp fixture according to embodiments of the present technology.
Figure 2:
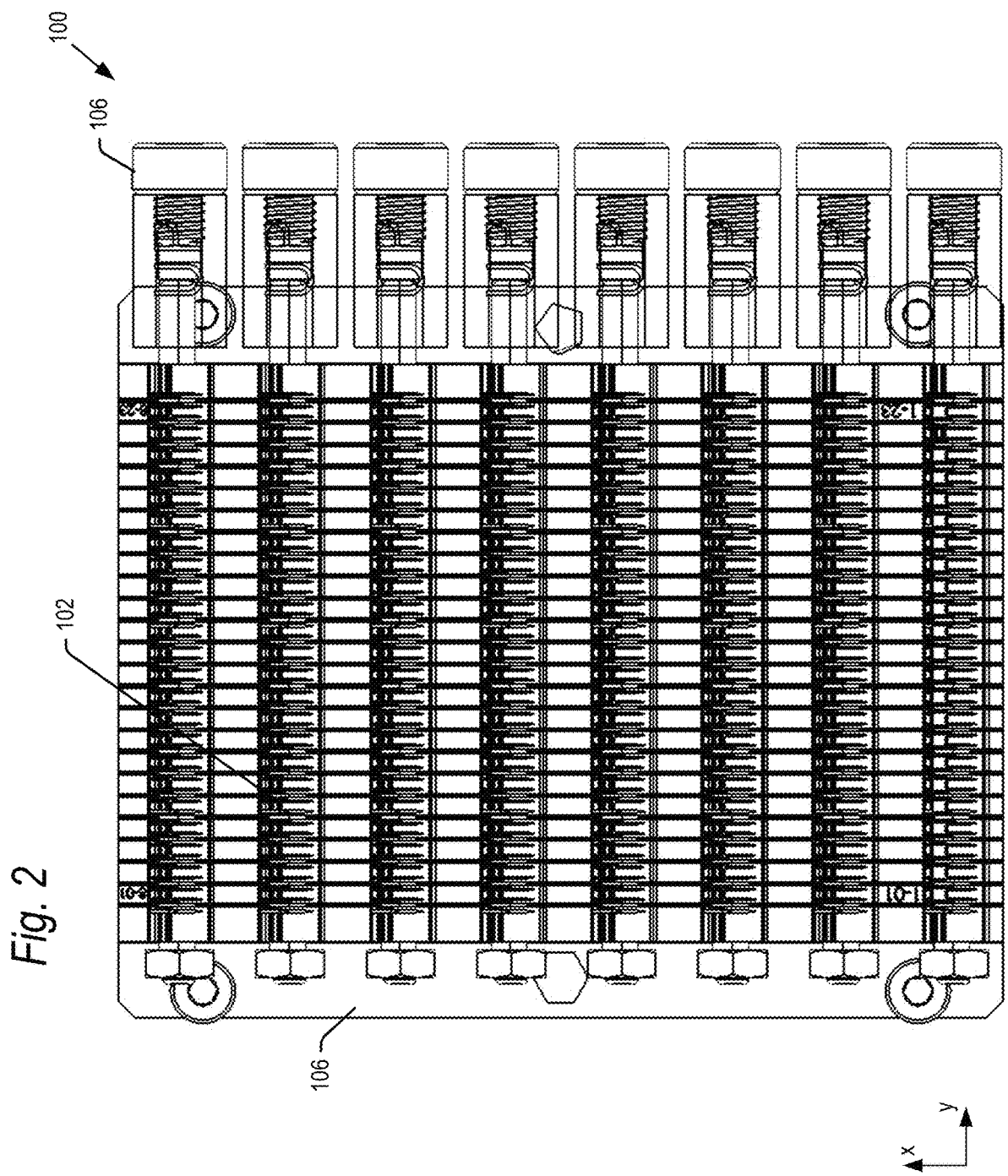
FIG. 2 is a top view of a clamp fixture according to embodiments of the present technology.
Figure 3:
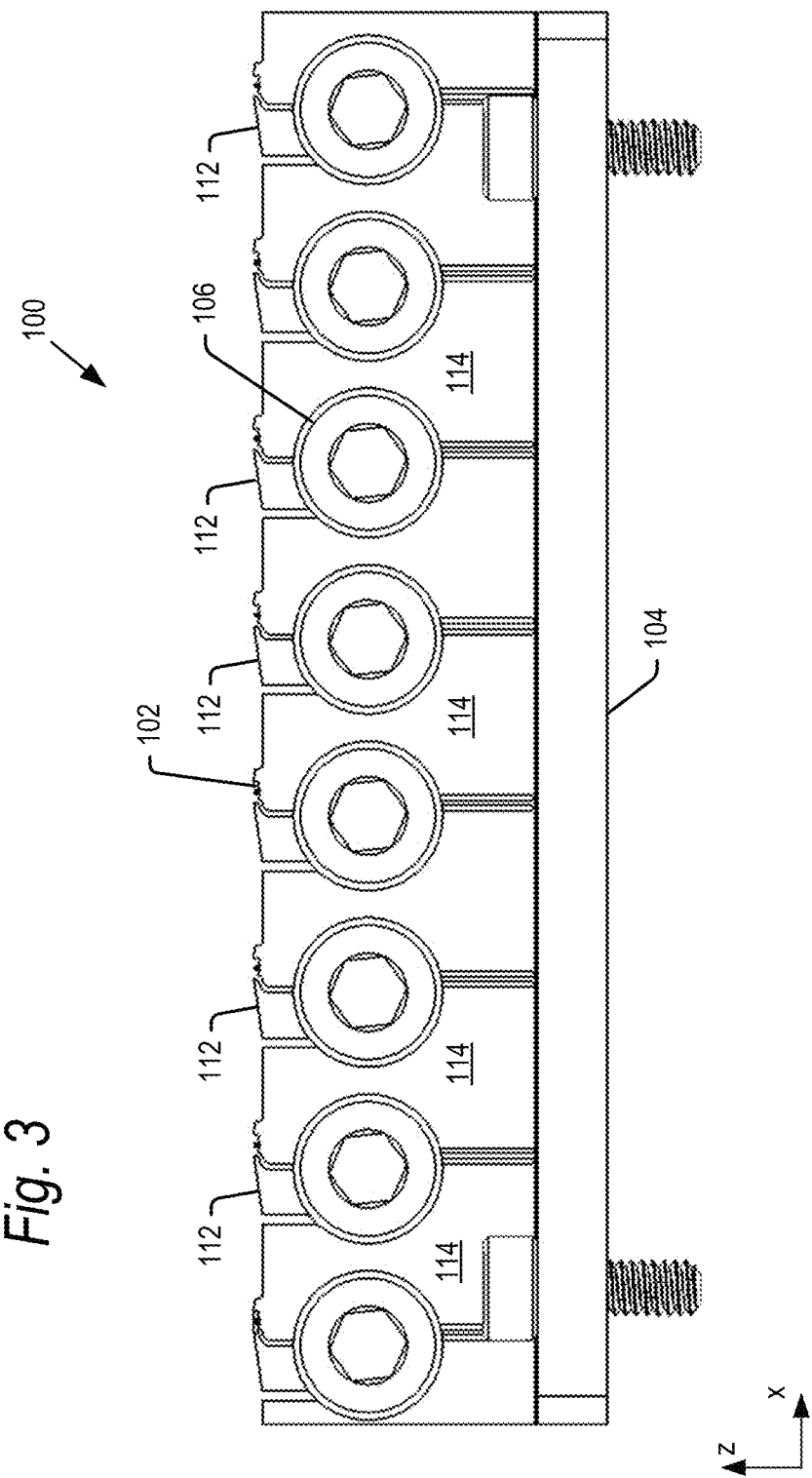
FIG. 3 is a front view of a clamp fixture according to embodiments of the present technology.

The present technology will now be described with reference to the figures, which in embodiments, relate to a high density slider clamp fixture for accurately positioning a large number of head sliders for metrology testing. In embodiments, the slider clamp fixture is a single piece, monolithic structure comprising a large number of slider nests, aligned in rows and columns in the slider fixture. Each slider nest includes a reference datum surface machined to precisely align with all other reference datum surfaces in a row of the monolithic structure. Each slider nest further includes a flexure clamp, again machined with precise alignment with all other flexure clamps along a row of slider nests, for independent clamping of each slider in the row against the reference datum surfaces.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top"/"bottom," "upper"/"lower" and "vertical"/"horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±0.25% of a defined component dimension.

Embodiments of the present technology will now be explained with reference to FIGS. 1-18. FIGS. 1-4 are perspective, top, front and side views, respectively, of a clamp fixture 100 according to the present technology. The clamp fixture is a monolithic structure machined to define a plurality of slider nests 102 (one of which is numbered in FIGS. 1-4) formed on a base 104. The slider nests 102 are machined into a plurality of rows, extending in the y-direction, and a plurality of columns, extending in the x-direction. The x, y and z orthogonal axes shown on the figures are arbitrarily selected for ease of reference, and may be changed in further embodiments. The base 104 may be screwed into a table of a tool or station as explained below with respect to FIGS. 15 and 16.

Figure 4:
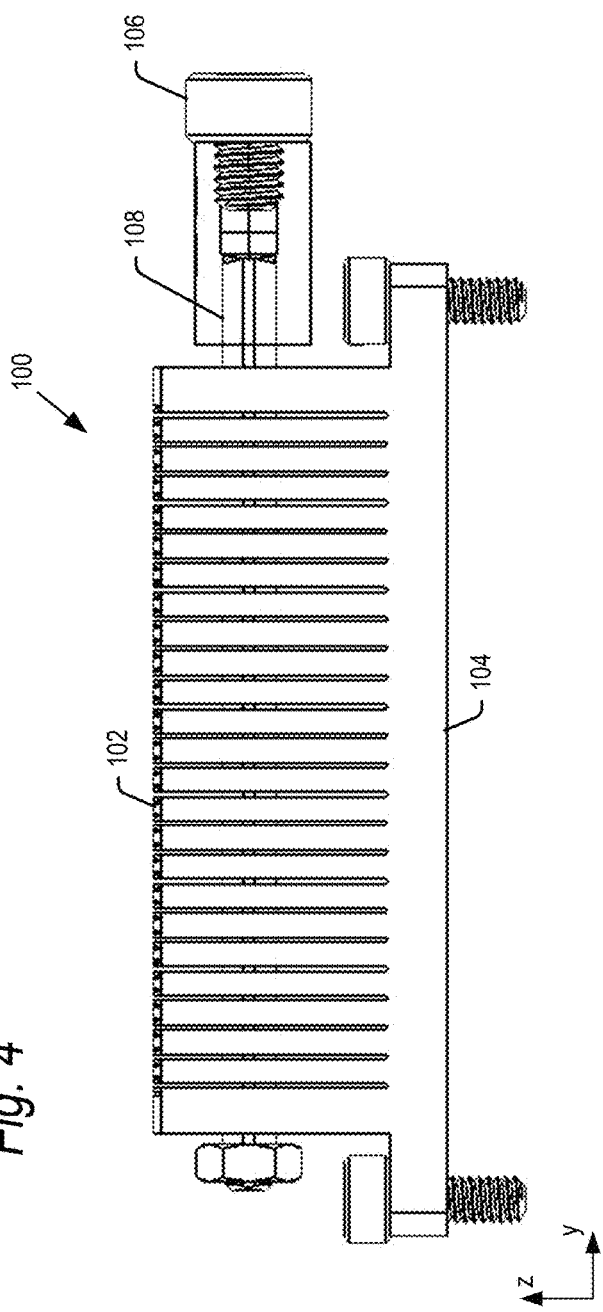
FIG. 4 is a side view of a clamp fixture according to embodiments of the present technology.
Figure 4A:
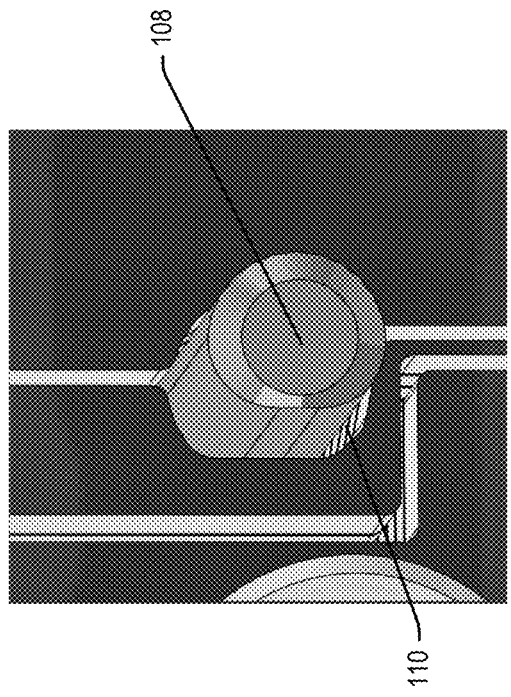
FIG. 4A is a front perspective view showing a cam shaft within the clamp fixture according to embodiments of the present technology.

The clamp fixture 100 further includes a number of cams 106 (FIGS. 1-4), one provided at the end of each row of slider nests 102. Each cam 106 includes a shaft 108 (FIGS. 4 and 4A) extending through an entire row of sliders. The shaft 108 of each cam 106 is non-circular, for example oblong, having a cross-sectional length which is greater than its cross-sectional width. The cam shaft 108 resides within openings 110 (FIGS. 4A, 5 and 6) defined between the flexures 112 and datum blocks 114 machined into a row in clamp fixture 100 as explained below. The cams 106 and cam shafts 108 are omitted from the rows of slider nests in FIGS. 5 and 6 to show detail of the flexure 112, datum blocks 114 and openings 110.

When a cam 106 is positioned such that the cross-sectional length of the cam shaft 108 is oriented within openings 110 in the z-direction, the flexures 112 in that row are in an unbiased position, referred to herein as the clamping position. When the cam 106 is positioned within the openings 110 such that the cross-sectional length of the cam shaft 108 is oriented in the x-direction, the flexures 112 in that row are in a biased position, referred to herein as an open position. When the cam 104 is rotated for example 90° from its clamping position to its open position, the wider cross-sectional length dimension of the cam shaft 108 biases the flexures 112 in that row away from datum blocks 114, thus allowing sliders to be inserted into or removed from each slider nest 102 in that row. When the cam is rotated 90° from its open position to its clamping position, the cam shaft 108 allows the flexures 112 in that row to move toward their unbiased positions (i.e., toward datum blocks 114), thus clamping each slider within a slider nest 102 in that row.

As indicated, rotation of a cam 106 releases or clamps all sliders in a given row simultaneously. As seen for example in FIGS. 5 and 6, the openings 110 in each row are defined between flexures 112 and datum blocks 114 in a given row of slider nests 102. Thus, the flexures 112 are nearly unbiased in their clamping positions. However, in further embodiments, the openings 110 may alternatively be positioned between the flexures 112 of a first row and the datum blocks 114 of an adjacent row. In such embodiments, the flexures 112 would be unbiased in their open positions.

Figure 5:
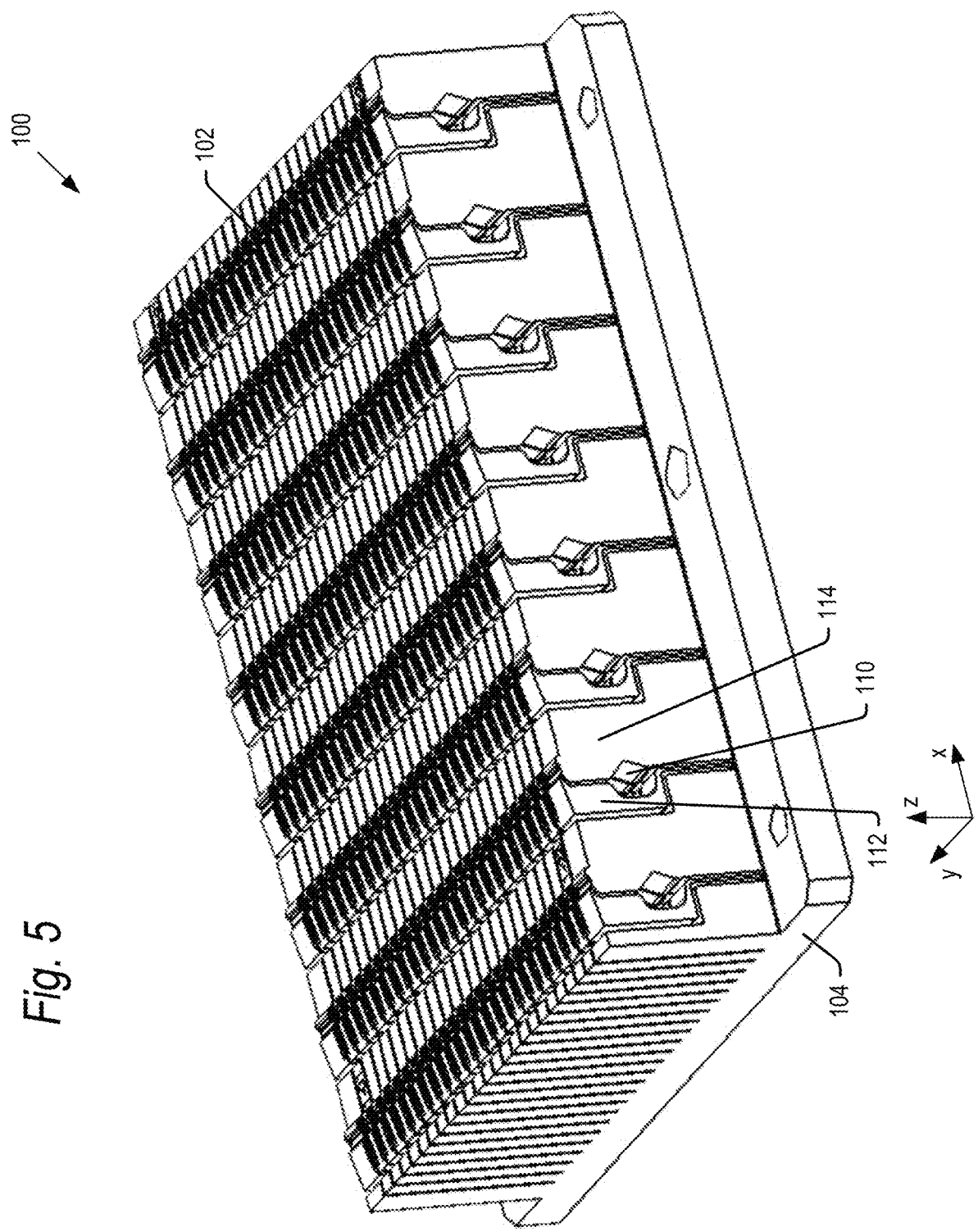
FIG. 5 is a perspective view of a monolithic structure of a clamp fixture according to embodiments of the present technology.
Figure 6:
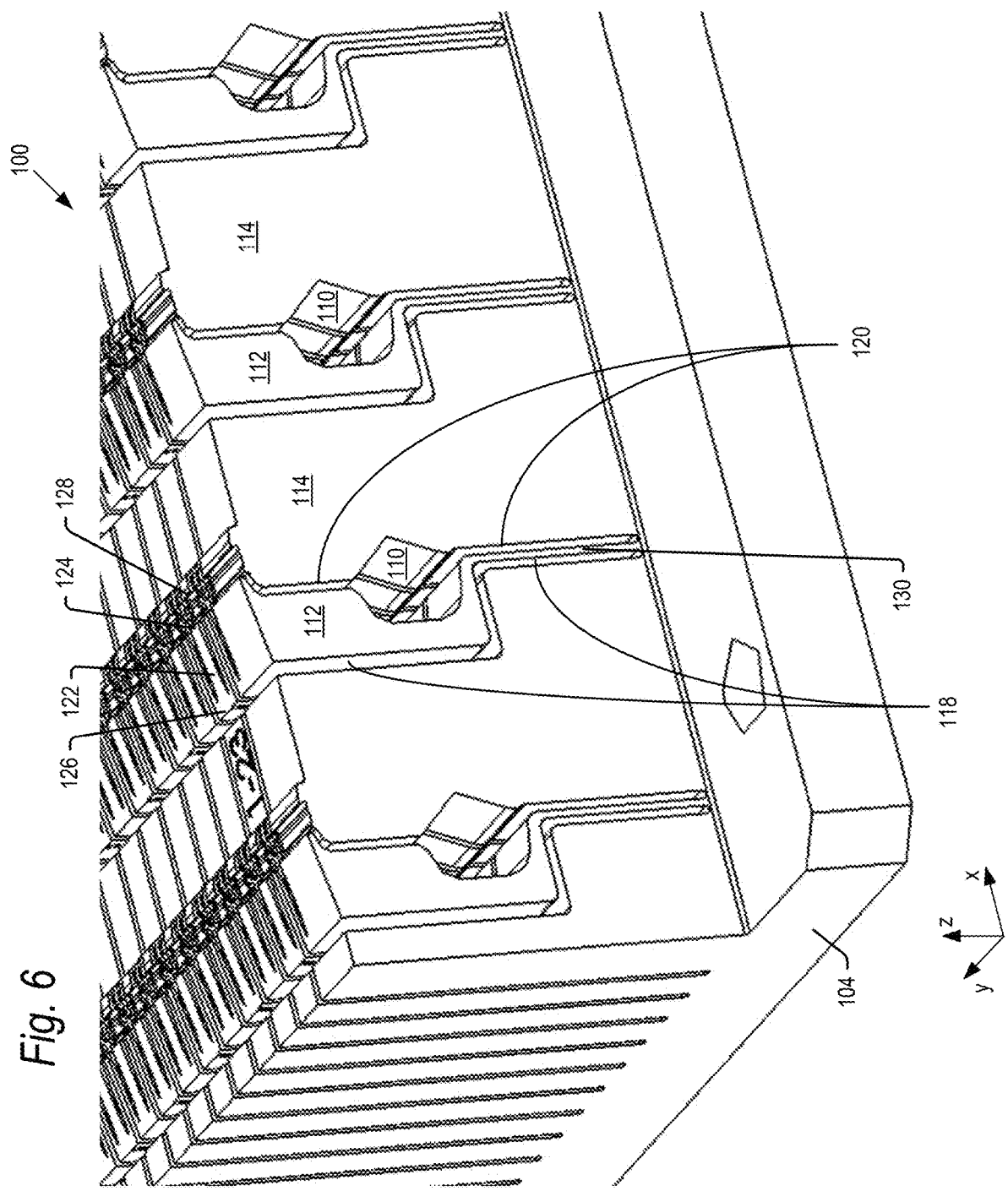
FIG. 6 is an enlarged partial perspective view showing a flexure and a datum block according to embodiments of the present technology.

FIGS. 5 and 6 show detail of the flexures 112, datum blocks 114 and openings 110 in few rows of slider nests 102. The flexures 112 in a row are defined by machining a first gap 118 and a second gap 120 down from an upper surface of the clamp fixture 100 to the base 104. The gaps 118 and 120 define a top 122 in each flexure (one of which is numbered in FIG. 6), spaced away from the base 104. The top 122 of each flexure includes a proximal edge 124 which engages a slider when the slider is clamped in the slider nest 102. The top 122 of each flexure further includes a distal edge 126, opposite the proximal edge 124.

The gaps 118 and 120 are machined so as to be near each other at a bottom portion 130 of each flexure 112 (one of which is numbered in FIG. 6), near base 104. The bottom portion 130 of flexures 112 is narrow and is the portion of the flexure 112 that bends when the cams 106 bias the flexures 112 away from the datum blocks 114. In embodiments, the gaps 118 and 120 are parallel to each other at the bottom portions 130, so that the bottom portions bend uniformly along their lengths as the flexures are moved to their biased, open position.

In general, the clamp fixture 100 may be formed of a durable hard material, such as for example stainless steel. Using finite element analysis, the width and length of the bottom portions 130 may be selected so that the flexures 112 may bend to their biased positions over a life of the clamp fixture 100 without mechanical stresses within the bottom portions 130 ever approaching a yield point of the steel. In embodiments, the clamp fixture may be formed of 440c, heat treated stainless steel. In embodiments, the bottom portions may have a width of about 100 microns (μm) and a length of about 10 mm. However, it is understood that the clamp fixture 100 may be formed of other materials, and the bottom portions 130 may have other dimensions, in further embodiments.

A reference datum edge 128 is also machined in a top of each datum block 114 as explained below. The spacing between the proximal edge 124 of the flexure 112 and the reference datum edge 128 defines the length of a slider nest 102, which may vary for example between 767 μm when flexure 112 is in an unbiased position, and 967 μm when the flexure 112 is biased away from the datum block 114. Allowing the flexures to open 200 μm at the top 122 of each flexure allows easy loading of sliders into the slider nests 102. It is understood that the gaps 118 may provide wider or narrower openings at the top 122 of the flexures in further embodiments.

The length of a slider (about 850 μm) may be slightly greater than the spacing between the proximal edge 124 of the flexure 112 and the reference datum edge 128 of datum block 114 (about 767 μm) when flexure 112 is in an unbiased position. Thus, each flexure 112 exerts a clamping force on a slider when the flexure 112 is in the clamping position. In embodiments, this clamping force may be about 5 to 10 grams, though this force may be greater or smaller than this in further embodiments.

Figure 7:
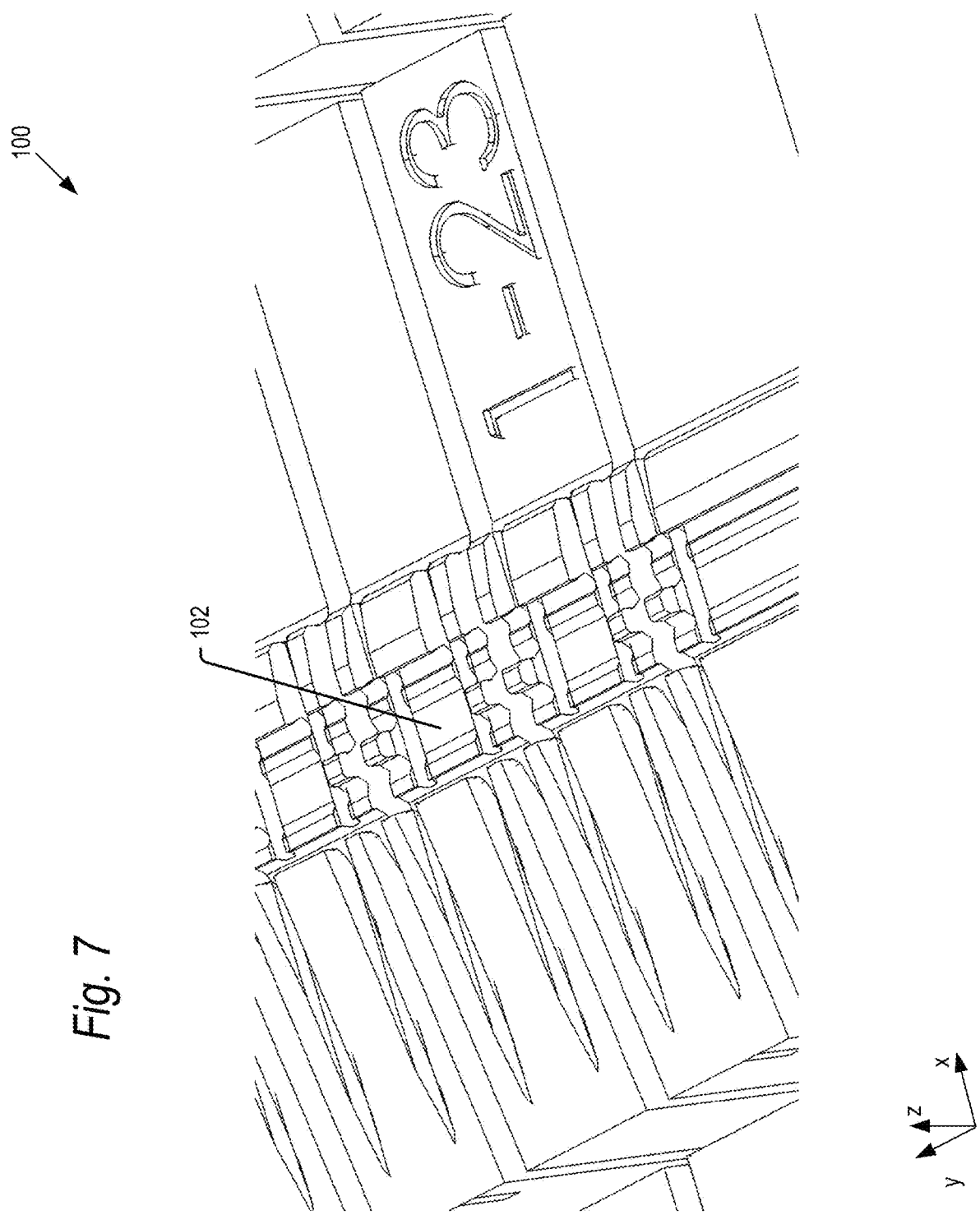
FIG. 7 is an enlarged partial perspective view showing a slider nest according to embodiments of the present technology.
Figure 8:
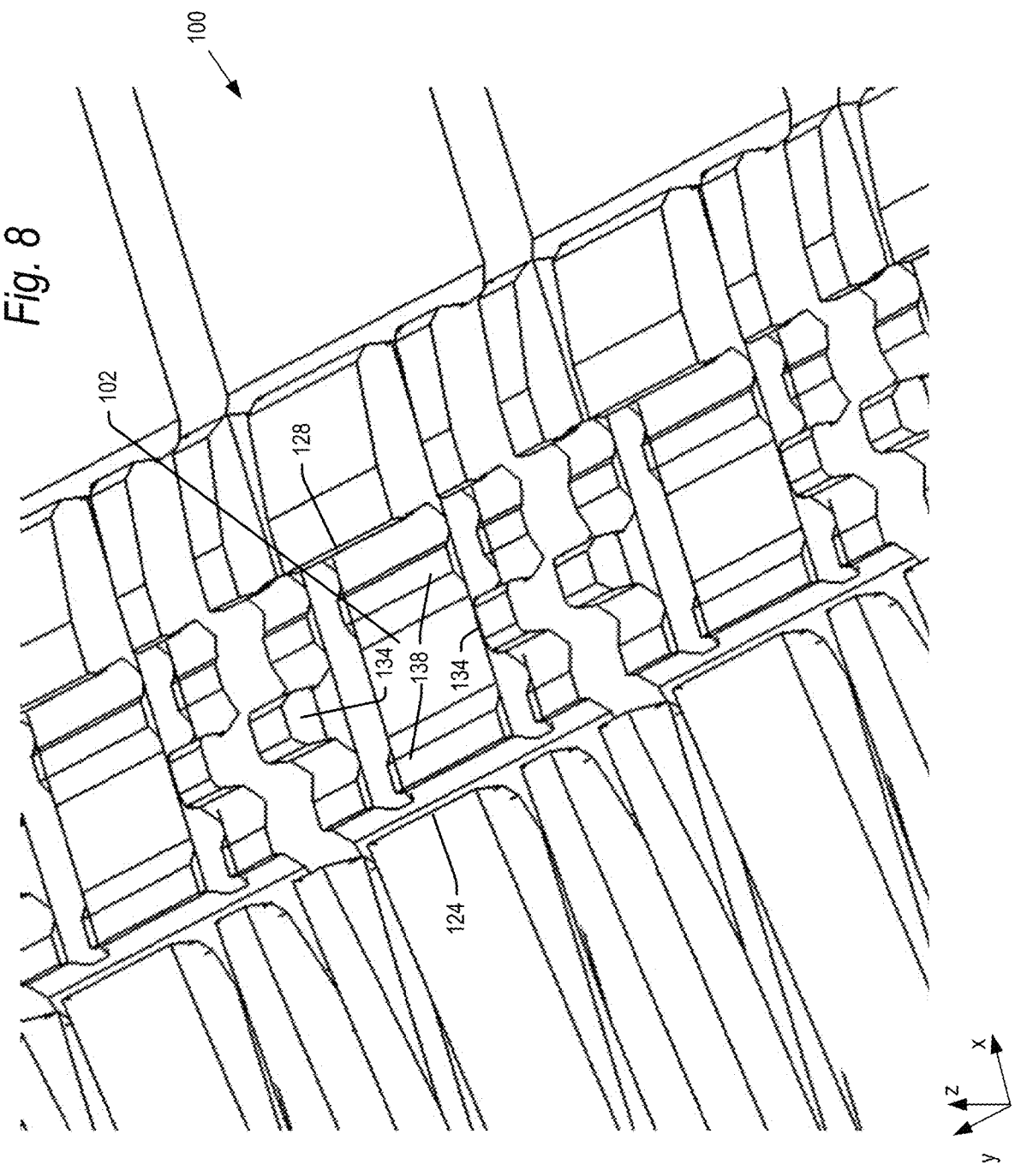
FIG. 8 is a further enlarged partial perspective view showing a slider nest according to embodiments of the present technology.

The top proximal edge 124 of flexure 112 and the reference datum edge 128 of datum block 114 are shown in greater detail in FIGS. 7 and 8. As noted above, it is critical to align a deposited end of each slider including the read and write layers to the same reference datum, but it is problematic in conventional designs giving the inability to properly clamp sliders having length variations due to manufacturing tolerances. In accordance with aspects of the present technology, each flexure 112 is machined to bend independently of each other flexure 112 in the clamp fixture 100. Thus, each slider is precisely clamped against the reference datum edge 128 by a flexure 112 in each slider nest, even where the length of the sliders vary slightly from nest to nest.

Additionally, giving that the clamp fixture 100 is a monolithic structure, machined with highly accurate cutting methods, the reference datum edges 128 in all slider nests 102 of a given row are precisely aligned with each other in the same datum reference plane. In addition to providing alignment of the deposited ends of each slider, the reference datum edges 128 also ensure orthogonality of each slider to the datum reference plane. This is significant in that the deposited end of each slider in a row may rest against this common datum plane when clamped to ensure alignment and orthogonality when the sliders are transferred to a wafer for testing as explained below.

The gaps 118 and 120, including top proximal edge 124, may also be uniformly machined for each slider nest in the y-direction along each row. The machining of the gaps 118 and 120, and the reference datum edges 128, are performed by high accuracy machining techniques using computer numerical control (CNC) tools. In one example, the machining may be performed by wire EDM (electrical discharge machining) and profile grinding. The wire EDM may be performed in multiple passes perpendicular to the x-z plane defined the profile of the flexures 112 and datum blocks 114. Multiple passes may be performed, with each successive pass making a finer cut (removing less material), to achieve accurate dimensions with tight tolerances (e.g., +/−5 μm) of the reference datum edges 128, and gaps 118 and 120.

The opening 110 in gap 120 may be formed by cutting out a core piece by wire EDM, and then making additional, finer cuts to achieve the desired shape of opening 110. Alternatively, a core of opening 110 may be removed for example by sinker EDM, followed by finer wire EDM cuts to achieve the desired shape of opening 110.

FIGS. 7 and 8 further show sidewalls 134 for positioning each slider within respective slider nests along the y-direction. In particular, sidewalls 134 guide sides defining the width of each slider (i.e., sides of the slider adjacent to the deposited end) into position within each slider nest 102. As compared to alignment in the x-direction, it is not as critical to precisely define the position of the sliders within each slider nest along the y-direction. Thus, the sidewalls 134 may be machined into the monolithic structure in fixed positions, with a spacing that is slightly larger than a width of a slider. In embodiments, a slider may be 700 μm wide, and the sidewalls 134 of each slider nest 102 may be spaced 720 μm+/−10 μm. The spacing sidewalls 134 within a slider nest 102 may be greater or smaller than that in further embodiments.

Figure 9:
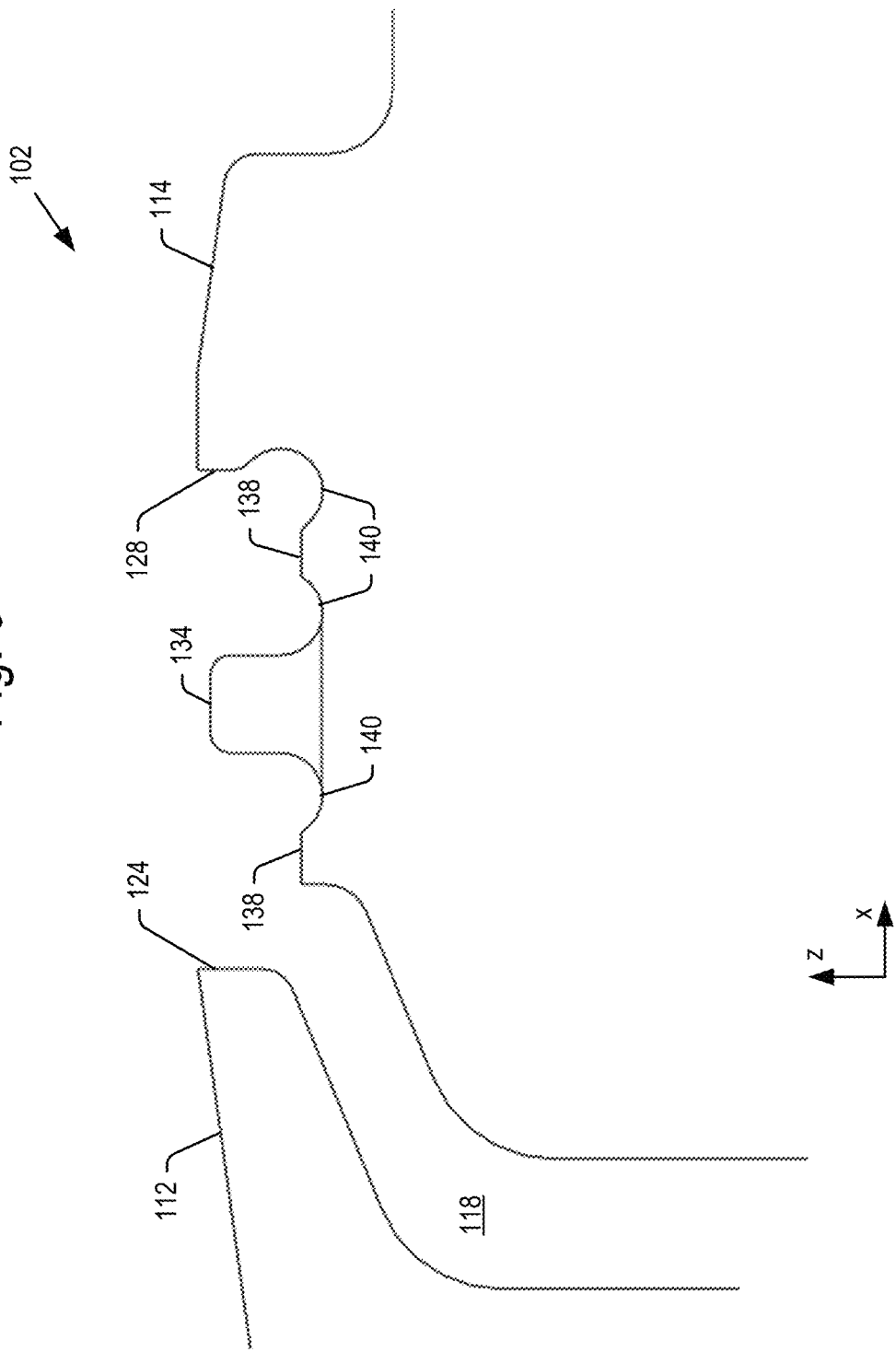
FIG. 9 is a side view showing a slider nest according to embodiments of the present technology.
Figure 10:
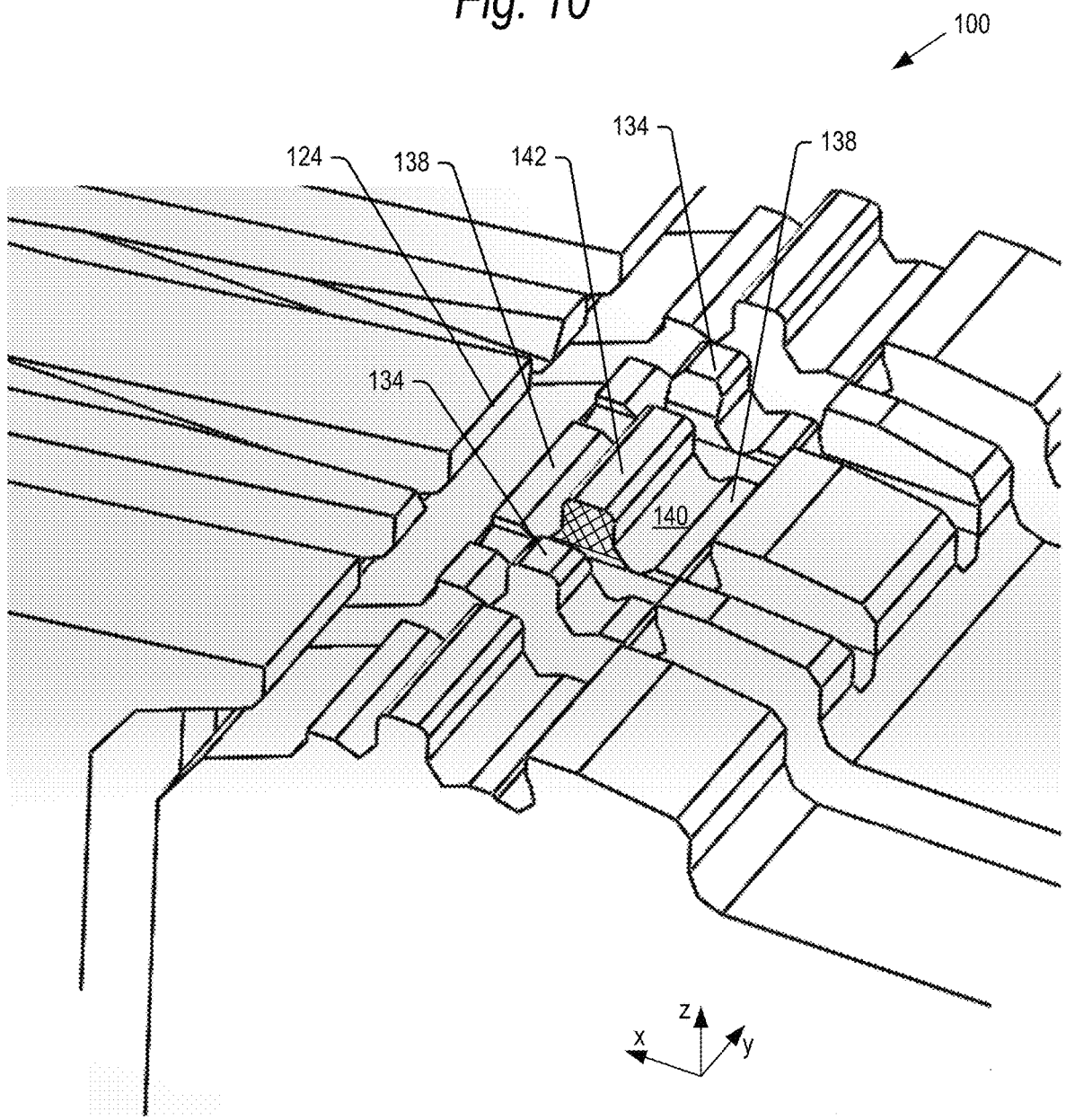
FIG. 10 is a perspective view of a slider nest at an intermediate stage of fabrication.
Figure 11:
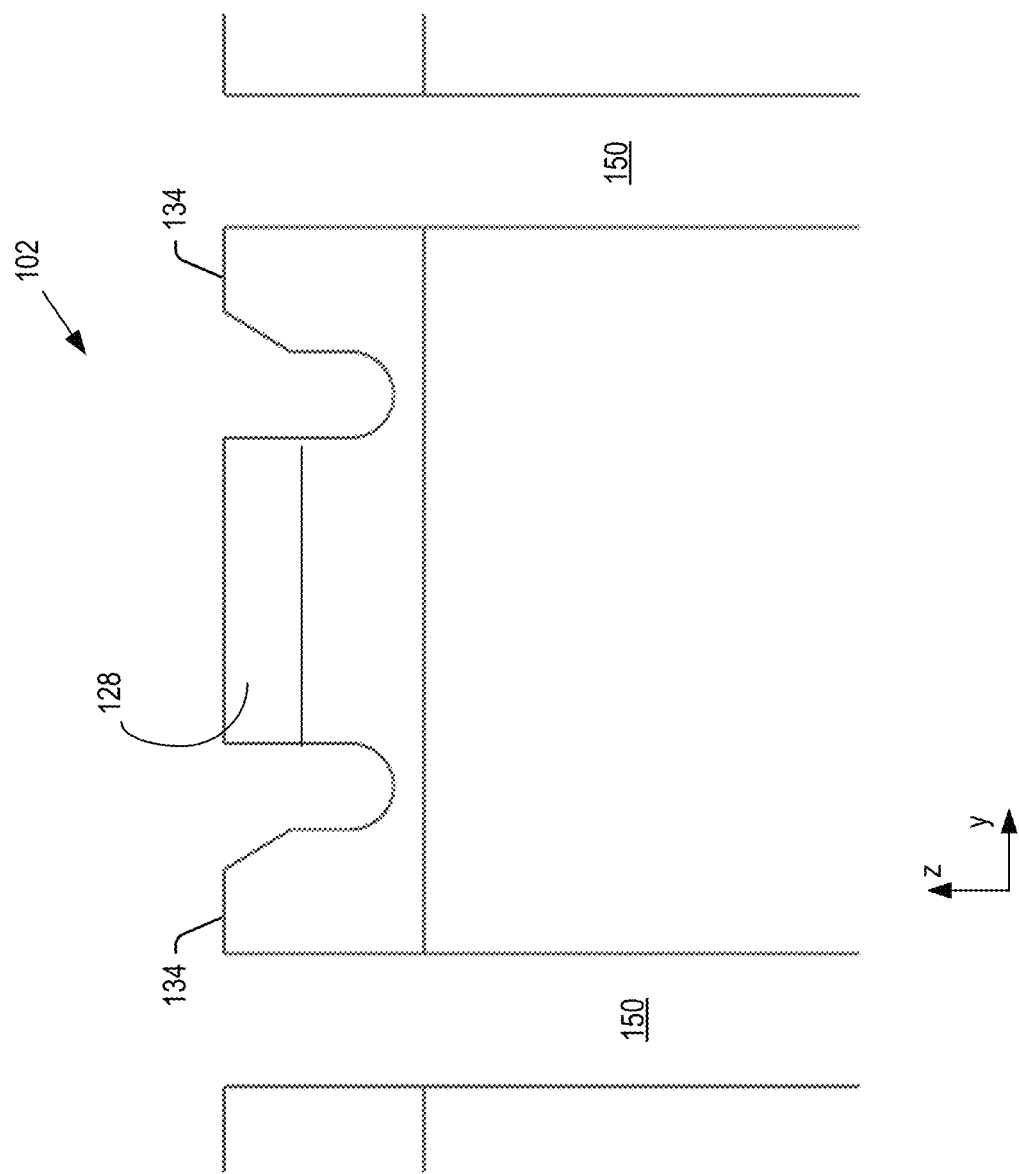
FIG. 11 is a front view showing a slider nest according to embodiments of the present technology.

Referring now to the perspective view of FIG. 8 and the side view of FIG. 9, each sidewall 134 may have a length (in the x-direction) of 150 μm, though the sidewalls 134 may be longer or shorter than that in further embodiments. Each sidewall 134 may extend 110 μm above a pair of pedestals 138, which support a slider by gravity, prior to being clamped, as explained below. The shape of each sidewall 134 (in the x-z plane shown in FIG. 9) may be defined in a wire EDM cutting process, such as for example the same wire EDM cutting process used define the reference datum edges 128 in a given row as described above. An upper portion of each sidewall 134 may have a beveled edge to guide a slider into the slider nest 102.

As seen for example in FIGS. 8 and 9, each slider nest 102 may further include a pair of flat rails or pedestals 138 oriented in the x-y plane for supporting the bottom surface of a slider. Each pedestal may have a width in the x-direction of about 80 μm, but this width may vary in further embodiments. The shape of each pedestal 138 (in the x-z plane shown in FIG. 9) may be defined in a wire EDM cutting process, such as for example the same wire EDM cutting process used define the reference datum edges 128 in a given row as described above.

Undercuts 140 may be formed adjacent the pedestals 138, to an elevation in the z-direction that is lower than the pedestals 138, to facilitate machining of the slider nests 102. In particular, referring to FIG. 10, after forming the sidewalls 134 in the x-z plane in the EDM wire cut, a chunk of excess material 142 (shown with cross hatch) is left between the pedestals 138 (in the x-direction) and between the sidewalls 134 (in the y-direction). This chunk of material 142 may be removed in a sinker EDM process to below a plane of the pedestals 138 so that the bottom surface of the slider may rest flat against the pedestals 138. The undercuts 140 are provided to account for tolerances in the sinker EDM process in removing the excess chunk of material 142.

In addition to the above-described machining in the y-direction, the monolithic structure of the clamp fixture 100 may be machined in the x-direction to define the profile of the clamp fixture 100 in the y-z plane. In particular, referring to FIG. 11, machining may be performed in the x-direction to separate each of the slider nests 102 from each other in a row, and to define the columns of slider nests 102. The columns of slider nests 102 may be formed by machining gaps 150 in the x-direction, from a top surface of the clamp fixture 100 down to the base 104, between each slider nest 102 in a row. The gaps 150 allow the respective flexures 112 in a row to move independently of each other. Each slider nest 102 may be separated from each other by a gap 150 of for example 200 μm, though the gap 150 may be wider or narrower in further embodiments.

Each individual slider nest 102 may further be machined in the x-direction to define the thickness of sidewalls 134 and a spacing between sidewalls 134. As above, the gaps 150 and the cuts to define sidewalls 134 may be performed by a wire EDM process or the like.

Figure 12:
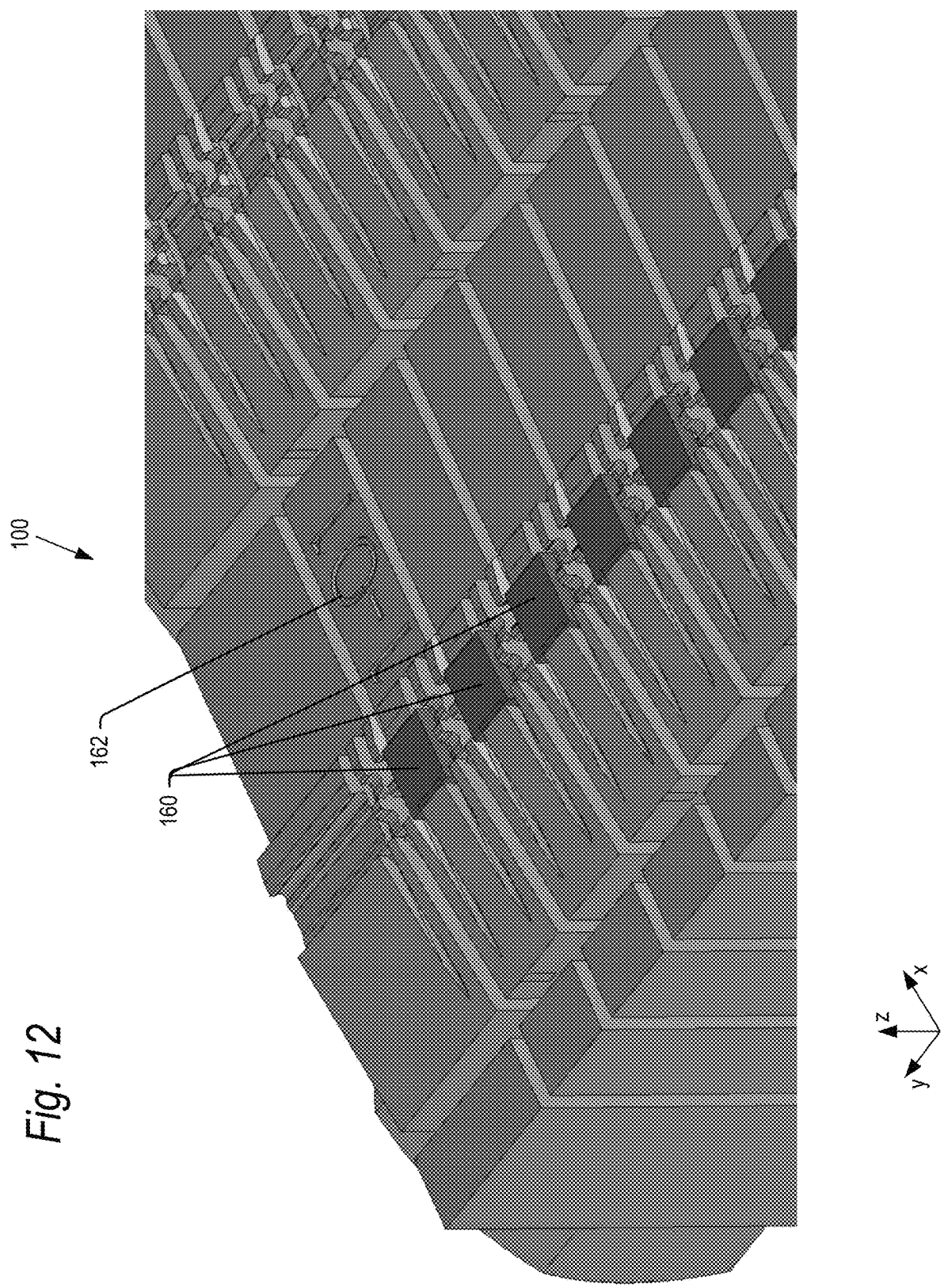
FIG. 12 is a perspective view of a portion of a clamp fixture including a number of sliders clamped within slider nests according to embodiments of the present technology.
Figure 13:
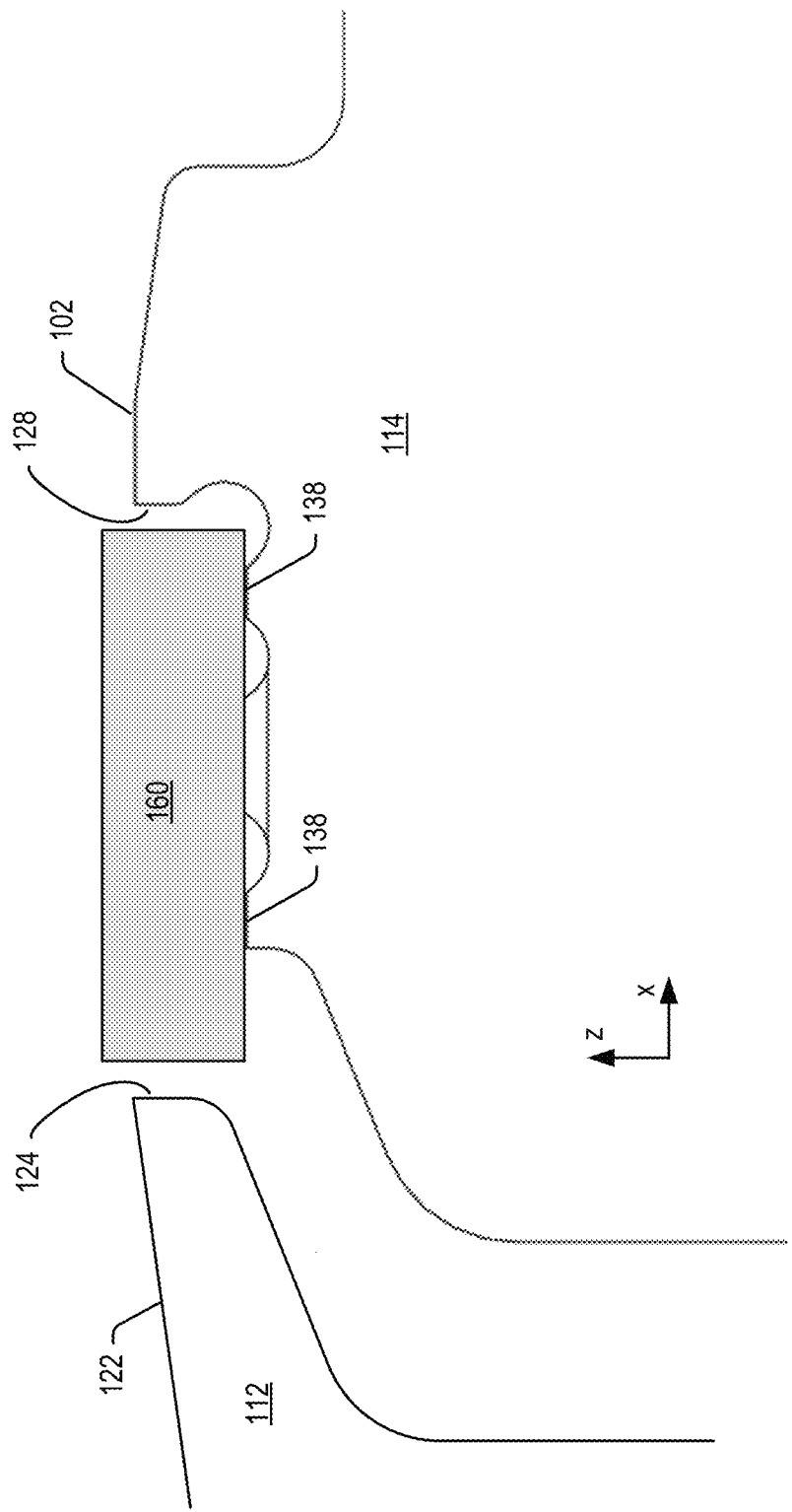
FIG. 13 is a side view of a slider in a slider nest, with the slider nest in an unclamped position according to embodiments of the present technology.
Figure 14:
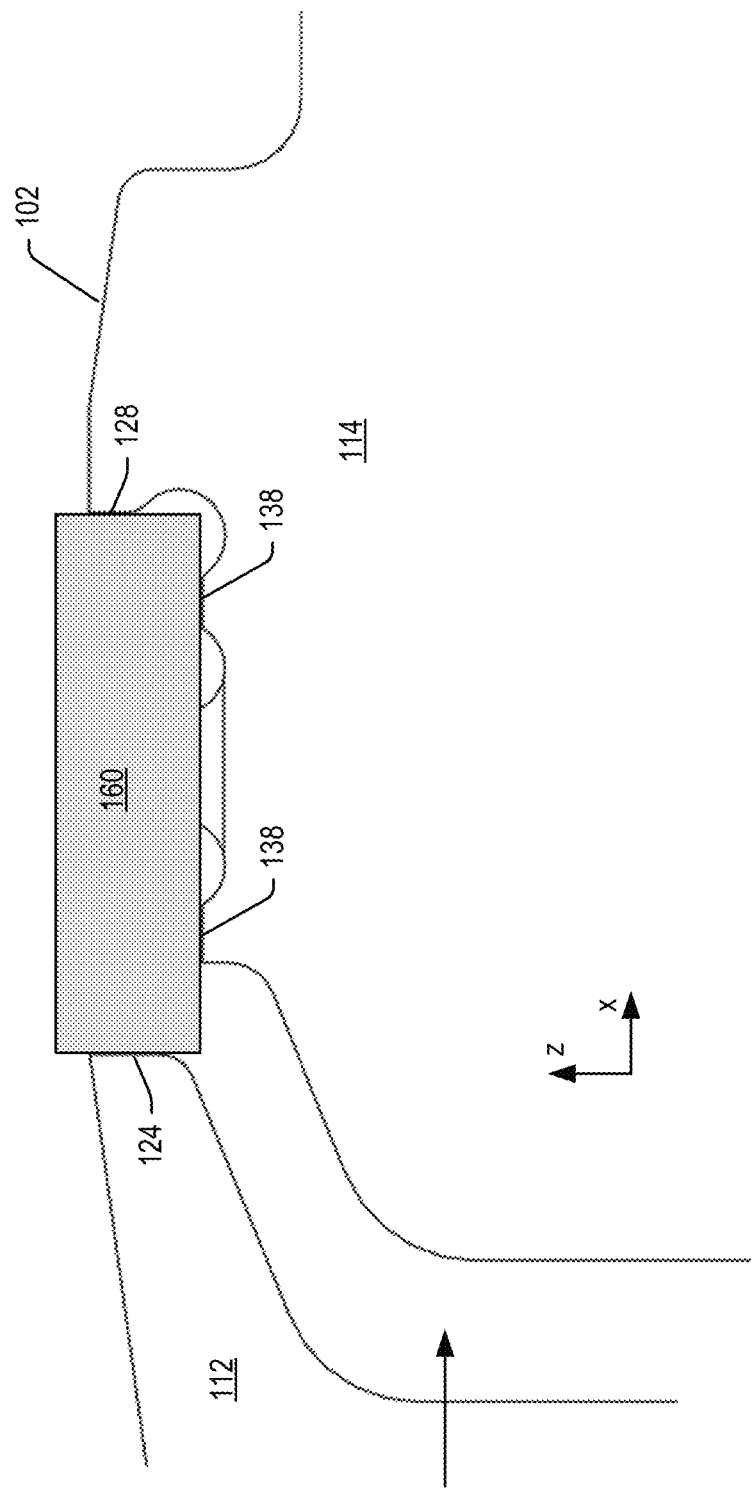
FIG. 14 is a side view of a slider in a slider nest, with the slider nest in an clamped position according to embodiments of the present technology.

FIG. 12 is a perspective view of a portion of a clamp fixture 100 showing a number of sliders 160 clamped within a row of slider nests 102. FIGS. 13 and 14 are side views showing a slider 160 seated within a slider nest 102. As described above, each slider 160 within a slider nest 102 is positioned between a pair of opposed sidewalls 134 in the y-direction, and may be clamped against a reference datum edge 128 of datum block 114 by independently actuated flexures 112 in the x-direction.

As noted, the clamp fixture 100 may be formed of 440c, heat treated stainless steel, but the clamp fixture 100 may be formed of other materials in further embodiments, including other metals and various ceramics or polymers. The clamp fixture 100 may be electrically conductive, and grounded when placed on a tool 170 as explained below. This prevents the build-up of electrostatic discharge (ESD).

As seen in FIG. 12, an upper surface of the clamp fixture 100 may be lasered or otherwise scribed to include markings 162 for identifying specific slider nests. While a single marking 162 is shown, additional slider nests may be marked in further embodiments. In the embodiment shown, the first number may indicate the row, and the second number may indicate the column, of a particular slider nest 102. Other naming conventions may be used. In one embodiment, there may be eight different rows in the x-direction, and twenty-three columns in the y-direction for a total of 184 slider nests. However, it is understood that there may be greater or fewer rows and/or greater or fewer columns in further embodiments.

In operation, the cam 106 (FIGS. 1-4) for a given row may be rotated to move the flexures 112 in that row to their open position. At that point, sliders 160 may be loaded into the slider nests 102 in that row, with an air bearing surface of the sliders 160 resting on the pair of pedestals 138, as shown in FIG. 13. The slider 160 may be loaded into a slider nest 102 manually, for example using a vacuum tweezers, or via an automated pick and place robot. Once all sliders 160 for the row are positioned in their respective nests 102, the cam 106 for that row may be rotated to the clamping position. Upon rotation of the cam 106, the flexure 112 in each slider nest 102 in the row moves toward the reference datum edge 128, to independently clamp each slider 160 in that row against the reference datum edge 128, as shown in FIG. 14.

Each slider 160 in a given row may be clamped simultaneously by rotating the cam for that row to the clamping position. Once a first row is clamped, the operation may be repeated to load and clamp sliders 160 into a second row, and so on until all rows of sliders are clamped in the clamp fixture 100. Clamping sliders one row at a time has an advantage that if the clamp fixture 100 is bumped while loading sliders in a given row, sliders in previously loaded rows will remain in position. However, it is conceivable that multiple rows of sliders be loaded, and then each of the cams on those rows closed together.

In embodiments, the top proximal edge 124 resides at the same z-elevation as the reference datum edge 128. Thus, no torque is exerted on the slider 160 when it is clamped.

Figure 15:
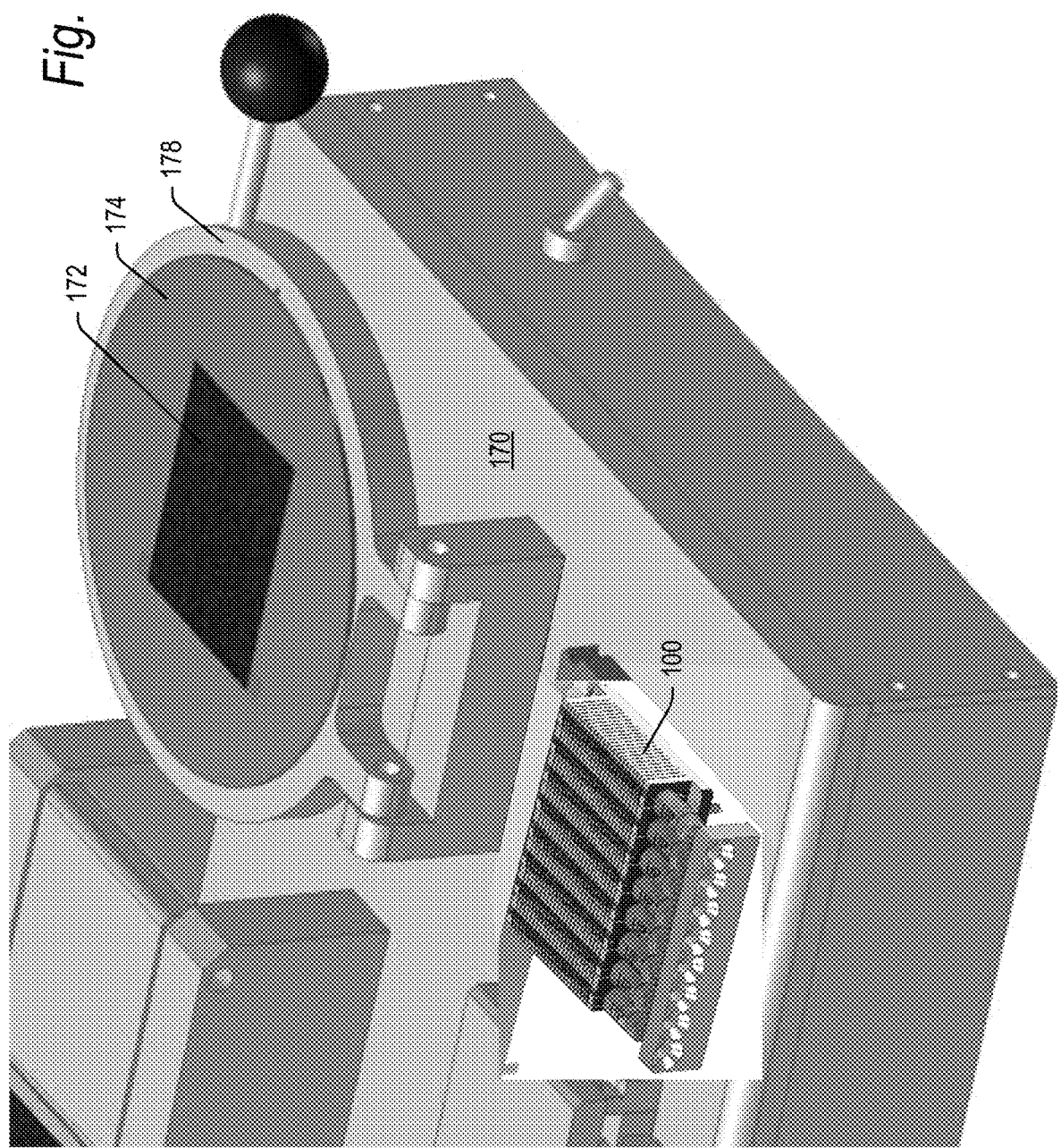
FIGS. 15 and 16 are perspective views of a tool for transferring sliders from a clamp fixture according to the present technology to an adhesive strip on a wafer.
Figure 16:
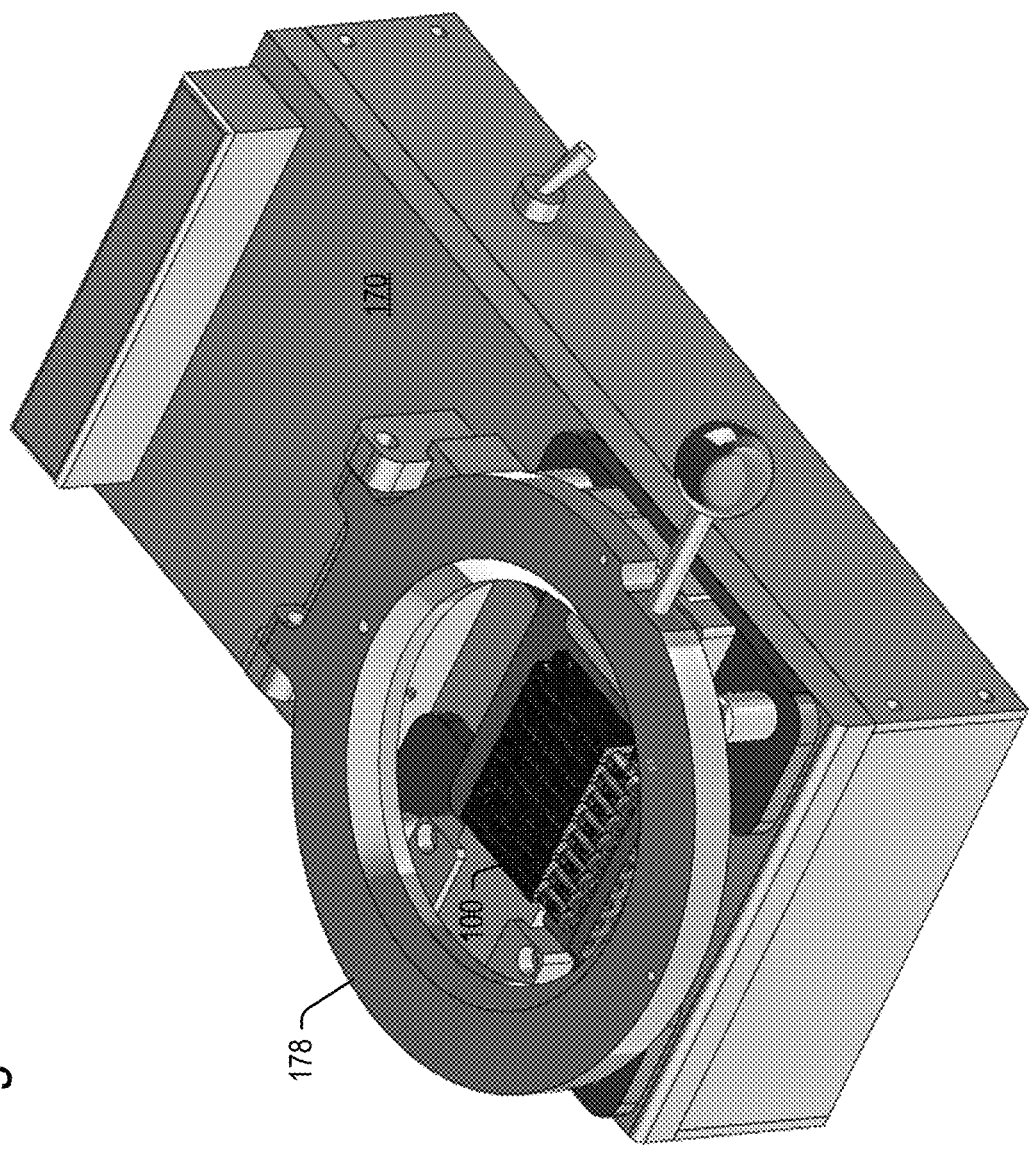
Figure 17:
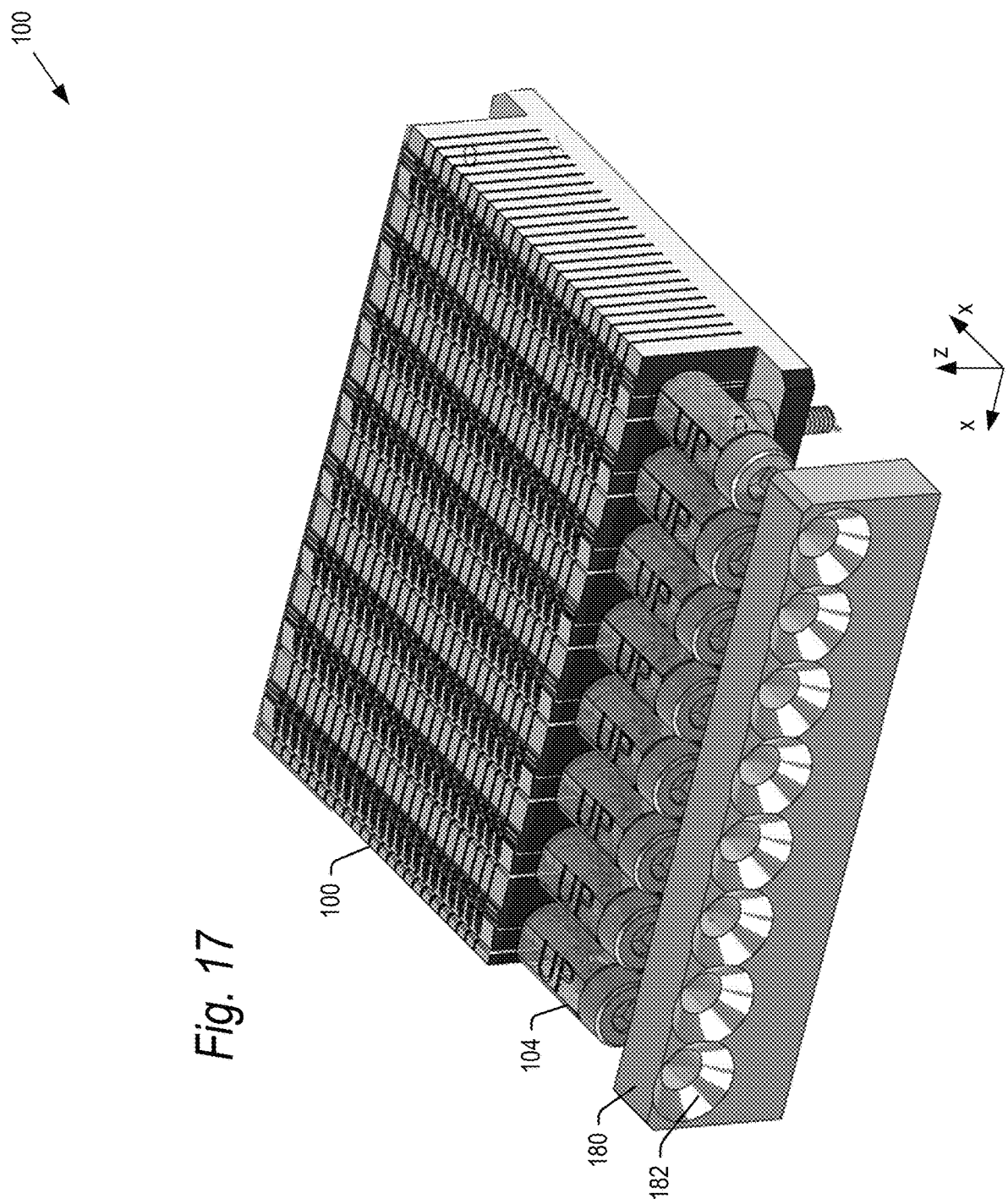
FIG. 17 is a perspective view of a clamp fixture and a guide for guiding an instrument for actuating the cams of the clamp fixture.

Referring now to FIG. 15, once all sliders 160 are loaded into the clamp fixture 100 as explained above, the fixture 100 may be seated on a tool 170 for transferring the sliders 160 from the fixture 100 to an adhesive strip 172 on a wafer 174. In particular, the clamp fixture 100 may be bolted or otherwise secured in a predefined position on a surface of the tool 170. The wafer 174 including the adhesive strip 172 may be affixed to a pivotally mounted paddle 178. Once the clamp fixture 100 is secured in position (FIG. 15), the paddle 178 may be manually or automatedly flipped over so that the adhesive strip 172 rests directly on top of the clamp fixture 100 (FIG. 16). The wafer 174 and adhesive strip 172 are omitted from FIG. 16 so that the clamp fixture 100 is visible.

As seen in FIG. 14 for example, an upper surface of the sliders 160 rest above an upper surface of the clamp fixture 100 (for example 20 μm above) when the sliders are clamped in nests 102. Thus, when the paddle 178 is flipped over, the adhesive strip 172 contacts the sliders 160 in the fixture 100, and does not contact the fixture 100. In any event, the top surface 122 of the flexure 112, and the top surface of the datum block 114 have surfaces which slope downward away from the slider 160. Thus, should contact occur between the adhesive strip 172 and the clamp fixture 100 (such as for example at nests not including any slider 160), the contact will be minimal, and the clamp fixture 100 will not adhere to the adhesive strip 172.

Referring again to FIG. 16, once the paddle 178 is flipped over so that the adhesive strip 172 rests firmly against the sliders 160 in the clamp fixture 100, the various cams may be actuated to move the flexures to their open position, for example with a screwdriver or other instrument (not shown). With the paddle 178 flipped over, it may be difficult to insert the instrument into the respective cams. As such, in embodiments, a guide 180 may be provided to facilitate positioning of the instrument into the respective cams. As shown in greater detail in FIG. 17, the guide 180 may include funneling holes 182 in order to guide the instrument into the respective cams 106. The guide 180 may be omitted in further embodiments.

Figure 18:
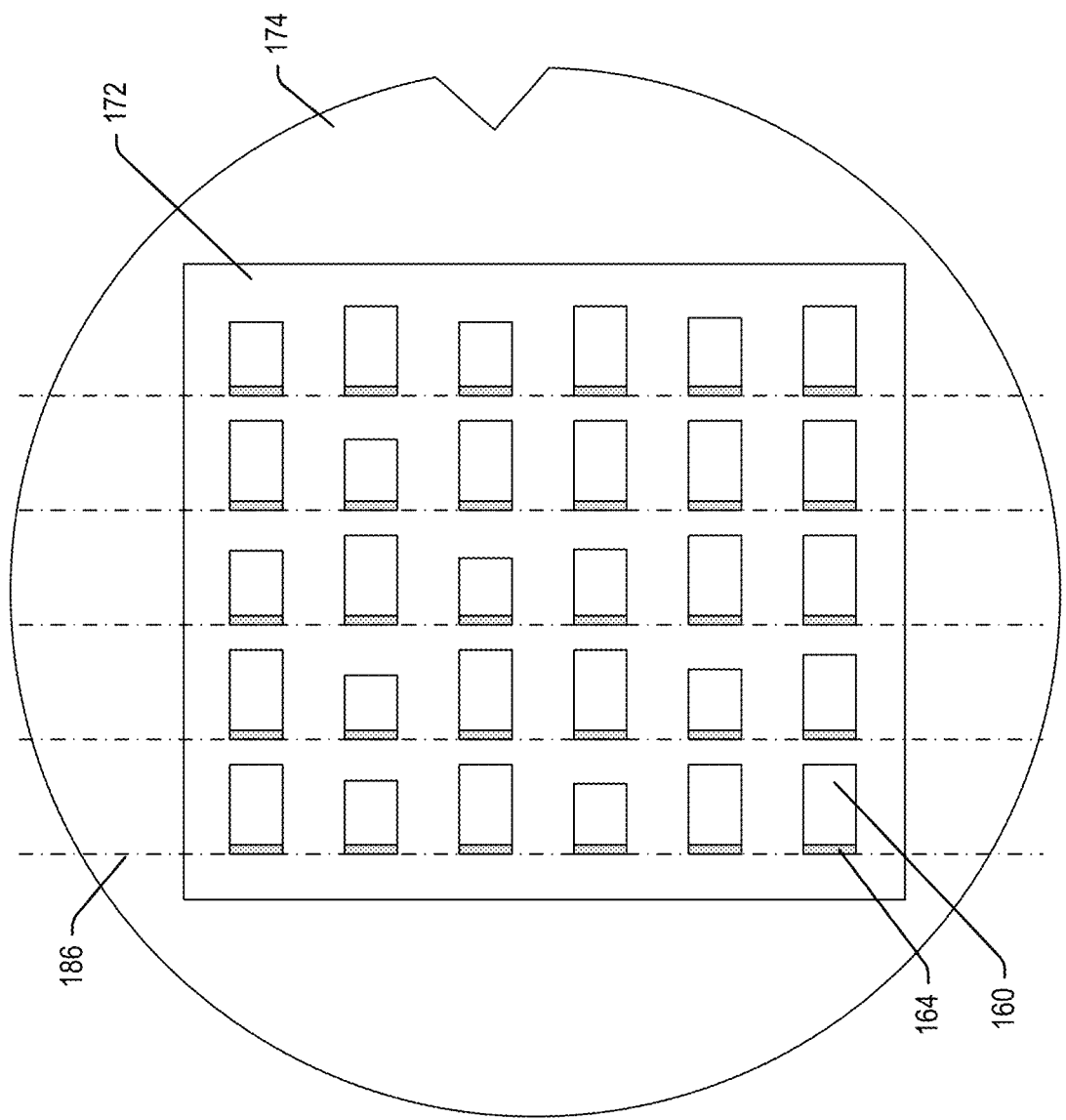
FIG. 18 is a top view of a wafer including a number of sliders aligned using the clamp fixture according to embodiments of the present technology.

Once all of the cams have been actuated to move all of the flexures to their open positions, the paddle 178 may be again flipped over with the sliders 160 now affixed to the adhesive strip 172 as shown in FIG. 18. In further embodiments, the sliders 160 may remain clamped within each slider nest 102 when the paddle 178 is flipped back to the position shown in FIG. 15. In particular, the adhesive strip 172 may exert over 20 grams of pulling force on the sliders 160. When the sliders are clamped for example with up to 10 grams force, the frictional holding force is typically less than 5 grams. Therefore, the adhesive strip 172 sufficiently overcomes the frictional holding force when the sliders are clamped to pull the sliders out from the slider nests.

As explained above, each row of sliders 160 (and in particular a deposited end 164 of the sliders 160) are precisely aligned against a reference datum, even with sliders having slightly different lengths owing to manufacturing tolerances. This precise alignment of the sliders transfers to the adhesive strip 172. As such, the deposited end of the sliders 160 in each row on the adhesive strip 172 remain precisely aligned to a reference datum 186. In one example, the clamp fixture 100 may provide an angular tolerance of +/−1.0 degree orthogonality, and a spacing tolerance of +/−25 μm between all sliders within the fixture 100. Thus, the deposited ends 164 of sliders 160 on the wafer 174 may be tested within a metrology tool, such as a CD-SEM, without work stoppage otherwise needed to fix misaligned sliders.

In summary, an example of the present technology relates to a clamp fixture for clamping a plurality of sliders, comprising: a monolithic structure comprising one or more rows of slider nests for receiving the plurality of sliders, a slider nest in a row comprising: a reference datum edge formed in the monolithic structure, the reference datum edge aligned with other reference datum edges in the row, and a flexure configured to clamp a slider of the plurality of sliders against the reference datum edge, the flexure configured to clamp the slider independently of other flexures in the row.

In a further example, the present technology relates to a clamp fixture for clamping a plurality of sliders, comprising: a monolithic structure comprising a row of slider nests for receiving the plurality of sliders, the row comprising: an edge configured to provide a reference datum against which sliders in the row may be aligned, a plurality of flexures configured to move between a clamping position where the plurality of flexures clamp the plurality of sliders against the edge, and an open position with a plurality of flexures do not clamp the plurality of sliders against the edge, the plurality of flexures configured to clamp the plurality of sliders independently of each other.

In another example, the present technology relates to a clamp fixture for clamping a plurality of sliders, comprising: a monolithic structure comprising a plurality of slider nests for receiving the plurality of sliders, the plurality of slider nests defined in rows extending in a first direction along the monolithic structure, each row comprising: a plurality of coplanar reference datum edges formed in the monolithic structure, and a plurality of flexures configured to clamp a group of the plurality of sliders against the plurality of reference datum edges, the plurality of flexures configured to clamp the plurality of sliders independently of each other; and one or more cams affixed to the monolithic structure and configured to actuate the plurality of flexures in each row between a clamping position where the plurality of flexures clamp sliders against the plurality of reference datum edges, and an open position where the plurality of flexures do not clamp sliders against the plurality of reference datum edges.

In a still further example, the present technology relates to a method of fabricating a clamp fixture for aligning a plurality of sliders in one or more rows against one or more reference datums, comprising: (a) machining a monolithic structure in a first direction to define a reference datum in each row of the one or more rows, and to form a pair of gaps in part defining individual flexures in each row of the one or more rows for independently clamping sliders against the reference datum in each row; and (b) machining the monolithic structure in a second direction, orthogonal to the first direction, to in part define the individual flexures in each row.

In another example, the present technology relates to a clamp fixture for clamping a plurality of sliders, comprising: alignment means for aligning the plurality of sliders against one or more reference datums; biasing means for independently clamping the plurality of sliders against the alignment means; and actuation means for actuating the biasing means between a clamping position where the biasing means clamp sliders against the alignment means, and an open position where the biasing means do not clamp sliders against the alignment means.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A clamp fixture for clamping a plurality of sliders, comprising:
a monolithic structure comprising one or more rows of slider nests for receiving the plurality of sliders, a slider nest in a row comprising:
a reference datum edge formed in the monolithic structure, the reference datum edge aligned with other reference datum edges in the row, and
a flexure configured to clamp a slider of the plurality of sliders against the reference datum edge, the flexure configured to clamp the slider independently of other flexures in the row.

2. The clamp fixture of claim 1, wherein the reference datum edge and flexure are configured to constrain the slider along a first axis, the slider nest further comprising a pair of sidewalls configured to guide the slider into the slider next along a second axis orthogonal to the first axis.

3. The clamp fixture of claim 1, wherein the monolithic structure further comprises a base, the flexure machined into the monolithic from a surface opposed to the base down to the base.

4. The clamp fixture of claim 3, wherein the monolithic structure further comprises a datum block extending from the base, the reference datum edge being machined into the datum block.

5. The clamp fixture of claim 3, wherein the flexure is defined by a pair of gaps machined from a surface of the monolithic structure down to the base.

6. The clamp fixture of claim 5, the flexure comprising a section adjacent to the base configured to bend.

7. The clamp fixture of claim 5, one of the pair of gaps machined to include a non-circular opening configured to receive a non-circular cam shaft.

8. The clamp fixture of claim 1, wherein the one or more rows comprise a plurality of rows.

9. The clamp fixture of claim 1, wherein the monolithic structure is formed of electrically conductive steel.

10. A clamp fixture for clamping a plurality of sliders, comprising:
a monolithic structure comprising a row of slider nests for receiving the plurality of sliders, the row comprising:
an edge configured to provide a reference datum against which sliders in the row are aligned,
a plurality of flexures configured to move between a clamping position where the plurality of flexures clamp the plurality of sliders against the edge, and an open position with a plurality of flexures do not clamp the plurality of sliders against the edge, the plurality of flexures configured to clamp the plurality of sliders independently of each other.

11. The clamp fixture of claim 10, further comprising a cam configured move the plurality of flexures between the clamping position and the open position.

12. The clamp fixture of claim 11, wherein the cam and monolithic structure are configured move the plurality of flexures together between the clamping position and the open position.

13. The clamp fixture of claim 10, the row of slider nests further comprising a pair of sidewalls for each slider nest, the pair of sidewalls configured to guide a slider of the plurality of sliders into the slider nest when the plurality of flexures are in the open position.

14. The clamp fixture of claim 10, the row of slider nests further comprising a pair of pedestals for each slider nest, the pair of pedestals configured to support a slider of the plurality of sliders when the slider is positioned in the slider nest with the plurality of flexures in the open position.

15. A clamp fixture for clamping a plurality of sliders, comprising:
a monolithic structure comprising a plurality of slider nests for receiving the plurality of sliders, the plurality of slider nests defined in rows extending in a first direction along the monolithic structure, each row comprising:
a plurality of coplanar reference datum edges formed in the monolithic structure, and
a plurality of flexures configured to clamp a group of the plurality of sliders against the plurality of reference datum edges, the plurality of flexures configured to clamp the plurality of sliders independently of each other; and
one or more cams affixed to the monolithic structure and configured to actuate the plurality of flexures in each row between a clamping position where the plurality of flexures clamp sliders against the plurality of reference datum edges, and an open position where the plurality of flexures do not clamp sliders against the plurality of reference datum edges.

16. The clamp fixture of claim 15, wherein the one or more cams and monolithic structure are configured move the plurality of flexures together between the clamping position and the open position.

17. The clamp fixture of claim 15, the row of slider nests further comprising a pair of sidewalls for each slider nest, the pair of sidewalls configured to guide a slider of the plurality of sliders into the slider nest when the plurality of flexures are in the open position.

18. The clamp fixture of claim 10, the row of slider nests further comprising a pair of pedestals for each slider nest, the pair of pedestals configured to support a slider of the plurality of sliders when the slider is positioned in the slider nest with the plurality of flexures in the open position.

19. A clamp fixture for clamping a plurality of sliders, comprising:
alignment means for aligning the plurality of sliders against one or more reference datums;
biasing means for clamping each of the plurality of sliders against the alignment means independently of each other; and
actuation means for actuating the biasing means between a clamping position where the biasing means clamp each of the sliders together against the alignment means, and an open position where the biasing means do not clamp the sliders against the alignment means.

* * * * *